(12) United States Patent
Jin

(10) Patent No.: US 10,529,844 B2
(45) Date of Patent: Jan. 7, 2020

(54) STRUCTURE OF TRENCH-VERTICAL DOUBLE DIFFUSED MOS TRANSISTOR AND METHOD OF FORMING THE SAME

(71) Applicants: Chip Integration Tech. Co., Ltd., Zhubei (TW); Qinhai Jin, Zhubei (TW)

(72) Inventor: Qinhai Jin, Zhubei (TW)

(73) Assignee: CHIP INTEGRATION TECH. CO., LTD., Zhubei, Hsinchu County (TW)

(*) Notice: Subject to any disclaimer, the term of this patent is extended or adjusted under 35 U.S.C. 154(b) by 166 days.

(21) Appl. No.: 15/212,575

(22) Filed: Jul. 18, 2016

(65) Prior Publication Data

US 2016/0329413 A1 Nov. 10, 2016

Related U.S. Application Data

(63) Continuation of application No. 14/311,521, filed on Jun. 23, 2014, now abandoned.

(30) Foreign Application Priority Data

Jun. 21, 2013 (TW) .............................. 102122295 A

(51) Int. Cl.
*H01L 29/66* (2006.01)
*H01L 29/78* (2006.01)
(Continued)

(52) U.S. Cl.
CPC ...... *H01L 29/7802* (2013.01); *H01L 21/2652* (2013.01); *H01L 29/0696* (2013.01);
(Continued)

(58) Field of Classification Search
CPC ............. H01L 29/0865; H01L 29/0657; H01L 29/66681–66704; H01L 29/7802–7815;
(Continued)

(56) References Cited

U.S. PATENT DOCUMENTS

2009/0061585 A1 3/2009 Banerjee et al.
2014/0197486 A1 7/2014 Kocon et al.

*Primary Examiner* — Lauren R Bell
(74) *Attorney, Agent, or Firm* — McClure, Qualey & Rodack, LLP

(57) ABSTRACT

A structure of trench VDMOS transistor comprises an n-epi-layer/ n+ substrate having trench gates formed therein, which have a trench oxide layer conformally formed and filled with a first poly-Si layer. A plurality of MOS structure formed on the mesas. Doubled diffused source regions are formed asides the MOS structure. An inter-metal dielectric layer is formed on the resulted surfaces. An interconnecting metal layer patterned as two is formed on inter-metal dielectric layer. The one is for source regions and the first poly-Si layer connection by source contact plugs and the other for the gate connection by gate contact plugs. In the other embodiment, the trenches are filled with a stack layer of a first oxide layer/a first poly-Si layer. The MOS gates with their second poly-Si layer in a form of rows are formed on the first oxide layer and the mesas. An inter-metal dielectric layer is formed on the resulted surfaces. An interconnecting metal layer is formed on the inter-metal dielectric layer and through the source contact plugs connecting the source regions and the first poly-Si layer. The drain electrode is formed on the rear surface of the n+ substrate for both embodiments.

2 Claims, 14 Drawing Sheets

(51) Int. Cl.
*H01L 21/265* (2006.01)
*H01L 29/08* (2006.01)
*H01L 29/40* (2006.01)
*H01L 29/423* (2006.01)
*H01L 29/06* (2006.01)
*H01L 29/10* (2006.01)
H01L 29/417 (2006.01)

(52) U.S. Cl.
CPC ........ *H01L 29/086* (2013.01); *H01L 29/1095* (2013.01); *H01L 29/407* (2013.01); *H01L 29/4238* (2013.01); *H01L 29/66727* (2013.01); H01L 29/41766 (2013.01)

(58) Field of Classification Search
CPC ............... H01L 29/401; H01L 29/1095; H01L 29/0856–0869; H01L 29/66333–66348; H01L 29/7395–7398; H01L 29/407
See application file for complete search history.

STRUCTURE OF TRENCH-VERTICAL DOUBLE DIFFUSED MOS TRANSISTOR AND METHOD OF FORMING THE SAME

RELATED APPLICATION

This application is a continuation application of prior application Ser. No. 14/311,521, which was filed on Jun. 23, 2014 of which is pending and incorporated herein by reference.

FIELD OF THE INVENTION

The present invention pertains to a semiconductor device, in particularly, to a structure of a trench-vertical doubled diffused MOS transistors and a method of making the same.

DESCRIPTION OF THE PRIOR ART

Among those of transistors with capability of withstand high reverse bias voltage, the double-diffused metal oxide semiconductor transistor DMOS may be one of the most preferred. In the DMOS devices, the vertical double diffused metal oxide semiconductor (VDMOS) transistor attracts further attention than the lateral double-diffused metal oxide semiconductor (LDMOS). The LDMOS structure is a planar device whereas the VDMS is a trench structure and the VDMS is thus with advantages of low cost and low open resistance (low on-resistance; RON). Parts of reasons for that may be due to the latter component has a higher integrated density and uses a whole rear surface side of the semiconductor substrate as its drain electrode. The trench MOS is one of VDMOS and with a higher integrated density than the average of VDMOS.

FIG 1*a* illustrates a conventional trench MOS disclosed in U.S. Pat. No. 8,304,825. An n− epi-layer 15 on an n+ semiconductor substrate 10 has trenches formed therein. A trench oxide layer 12 is then formed on the sidewall and the bottom of the trenches. A conductive poly-Si layer 13 served as a gate region G is then filled in the trenches. The p− bodies 14 having n+ implanted region 11 formed therein are served as source regions 11. The inter-metal dielectric layer 17 having contact holes is formed on the resulted surfaces. An interconnecting metal layer 19 is formed on the inter-metal dielectric layer 17 and filled the contact holes to form contact plugs. The interconnecting metal layer 19 through source contact plugs 18 connected to the source regions 11. Another interconnecting metal layer (not shown) is connected to the trench gate. The drain electrode 10 is a metal layer formed on the rear surface of the n+ semiconductor substrate.

FIG. 1*b* shows a top view illustrating an interconnecting metal layer 19 connected to the source regions 11 by source contact pads Scp. The interconnecting metal layer for gates Gp are connected to the poly-Si layer 13 through the gate contact pad Gcp.

SUMMARY OF THE INVENTION

An object of the present invention is to disclose a trench vertical doubled diffused MOS transistor (VDMOS transistor).

According to a first preferred embodiment, the VDMOS transistor comprises an n− epi-layer on a n+ semiconductor substrate having a plurality of trenches in parallel formed therein and the trenches are spaced each other by a mesa; each of the trenches has a trench oxide layer formed on a bottom and sidewalls and a first conductive poly-Si layer filled in the trench; a plurality of planar gates having a second poly-Si layer on a planar gate oxide layer are formed on the mesas; a plurality of source regions are formed in the n− epi-layer at the mesas asides the planar gates; each of the source regions is a region having doubled diffused impurities formed therein; an inter-metal dielectric layer having source contact holes and gate contact holes formed therein, is formed on the source regions, the first poly-Si layer, and the planar gates; a first interconnecting metal layer is formed on the inter-metal dielectric layer and connected to the source regions through the source contact plugs; a second interconnecting metal layer is formed on the inter-metal dielectric layer and connected to the planar gate through the gate contact plugs; and a rear metal layer served as a drain electrode is formed on a rear surface of the n+ semiconductor substrate; each of the source regions includes a p body, a shallower n+ region extended to the mesa surface formed in the p body, and a p+ region formed in the p body right at a bottom of the source contact plug.

According to a second preferred embodiment, the VDMOS transistor comprises a n− epi-layer on a n+ semiconductor substrate having a plurality of trenches formed in parallel therein and the trenches spaced each other by a mesa; each of the trenches has a trench oxide layer formed on a bottom and sidewall and a stack of first oxide layer/ a first conductive poly-Si layer filled in the trench; a planar gate oxide layer is formed on the mesas and a plurality of rows of a second poly-Si layer extended to the ends of the substrate, are formed on the planar gate oxide layer and the first oxide layer; a plurality of source regions are formed in the n− epi-layer asides the planar gates; each of the source regions is a region having doubled diffused impurities formed therein; an inter-metal dielectric layer having source contact holes, is formed on the source regions, the first oxide layer, and the planar gates; a interconnection metal layer is formed on the inter-metal dielectric layer and is connected to the source regions through the source contact plugs; a interconnection metal layer is formed on the inter-metal dielectric layer and connected to the planar gate through the source contact plugs; and a rear metal layer served as a drain electrode is formed on a rear surface of said n+ semiconductor substrate. Each of the source regions includes a p body, a shallower n+ region extended to the mesa surface formed in the p body, and a p+ region formed in the p body at a bottom of the source contact plugs.

BRIEF DESCRIPTION OF THE DRAWINGS

FIG. 1*a* is a cross-sectional view illustrating a trench MOS transistor in accordance with a prior art;

FIG. 1*b* is a top view illustrating the trench MOS transistor in accordance with the prior art;

FIG. 2*a* is a top view illustrating a VDMOS transistor (interconnecting metal layers not shown) in accordance with the first preferred embodiment of the present invention;

FIG. 2*b* is a top view illustrating a VDMOS transistor (an interconnecting metal layer not shown) in accordance with the second preferred embodiment of the present invention;

FIG. 3 is a cross-sectional view illustrating a plurality of trenches formed in the n− epitaxial layer and a trench oxide layer successively formed thereon in accordance with the first preferred embodiment of the present invention;

FIG. 4 is a cross-sectional view illustrating a first conductive poly-Si layer refilled in the trenches until overfilled and then an etch back performed to remove the first poly-Si layer and the trench oxide layer over the mesas in accordance with the first preferred embodiment of the present invention;

DESCRIPTION OF THE PREFERRED EMBODIMENT

The present invention discloses a trench-vertical doubled diffused MOS transistor, hereinafter called a VDMOS transistor. Please refer to a top view shown in FIG. 2a and its corresponding cross-sectional views shown in FIG. 8A to 8C according to a first preferred embodiment of the present invention and a top view shown in FIG. 2b and its corresponding cross-sectional views shown in FIG. 15A to 15C according to a second preferred embodiment of the present invention. Hereinafter, the uppercase A, B, C in FIG. # A, FIG. # B, FIG. #C represent, respectively, along the cutting lines AA', BB' and CC' of the top views FIG. 2a or FIG. 2b. The label "+" and "−" following n or p represent, respectively, heavily doped (implanted) and lightly doped (implanted). To facilitate illustrating the detailed structure, the interconnecting metal layers 191s, 191g do not shown in the top plan views. As to the detailed connection relationship between elements in the semiconductor device, please refer to the cross-sectional views shown in FIG. 8A, FIG. 8B, and FIG. 8C.

Figure 2A:
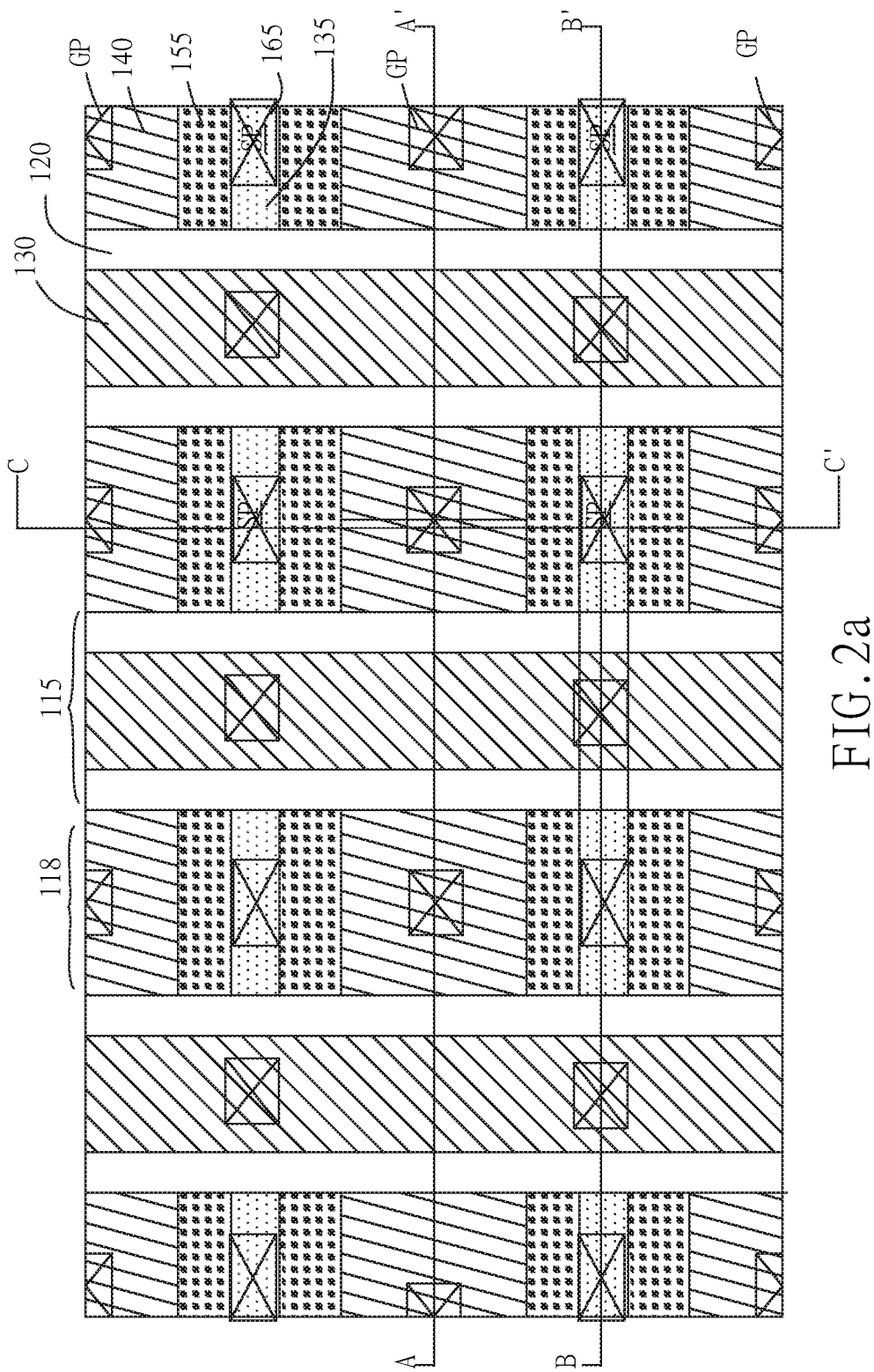
Figure 8A:
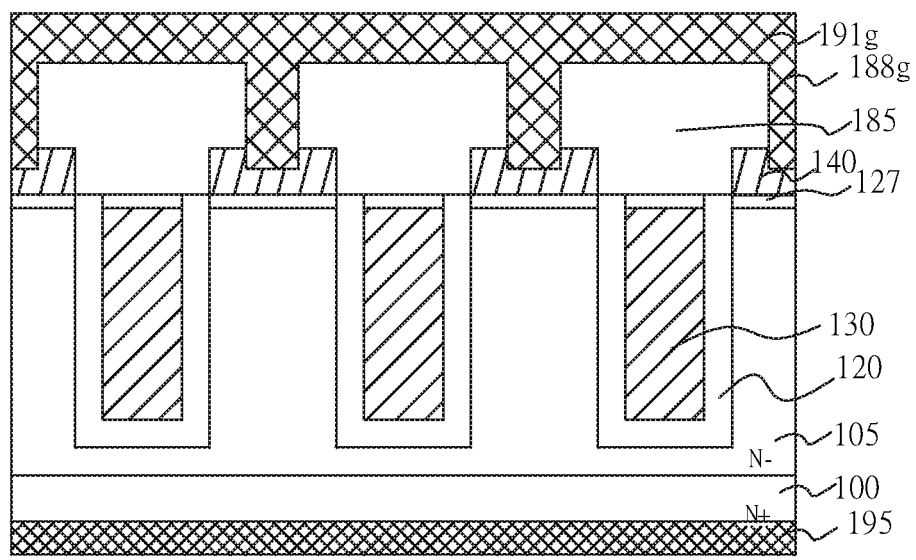
FIG. 8A, FIG. 8B and FIG. 8C are the cross-sectional views respectively, along the A-A' line, the B-B' line and the C-C' line shown in FIG. 2a illustrating the final structure of a VDMOS transistor in accordance with the first preferred embodiment of the present invention.
Figure 8B:
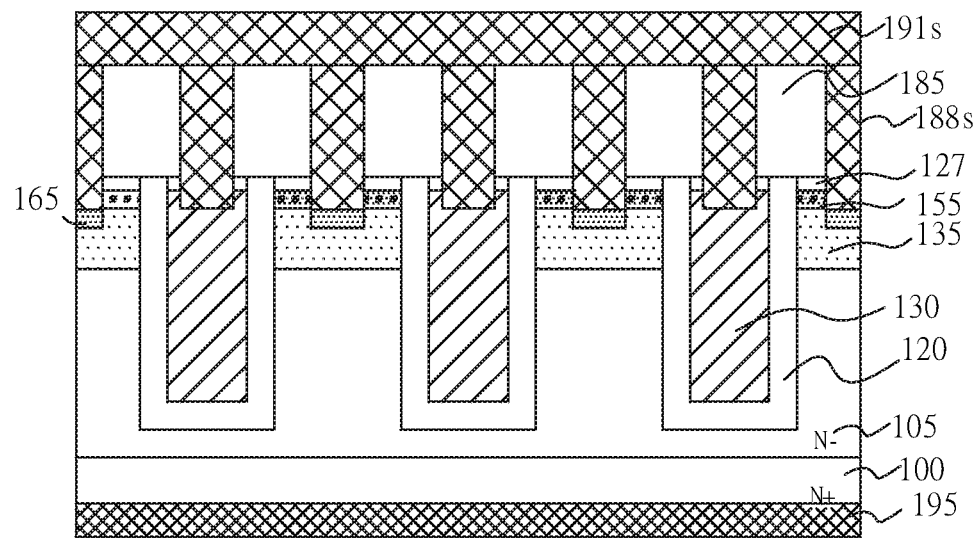
Figure 8C:
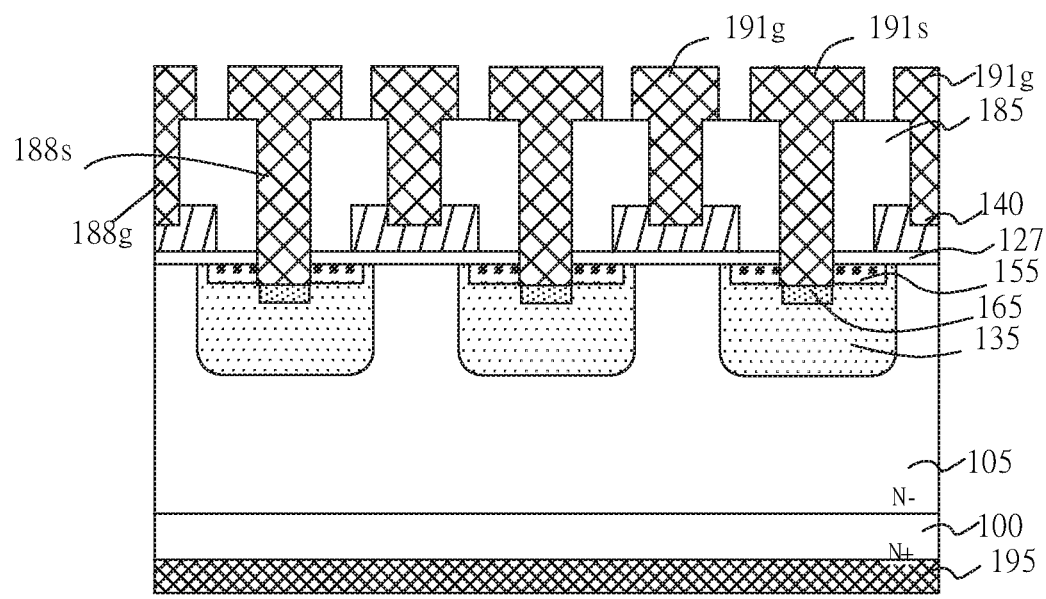

In accordance with a first preferred embodiment of the present invention, a trench VDMOS transistor is illustrated in the plan-view FIG. 2a and its cross-sectional views, FIG. 8A, FIG. 8B and FIG. 8C. The figures show an n− epi-layer 105 on a n+ semiconductor substrate 100 having a plurality of trenches 115 in parallel and spaced each other with a mesa 118 formed therein. A trench oxide layer 120 is conformally formed on bottoms and sidewalls of the trenches 115. A first poly-Si layer 130 having conductive impurities in-situ doped is formed on the trench oxide layer 120 and filled in the trenches 115. A planar gate oxide layer 127 is formed on the mesas 118 and on the first poly-Si layer 130. A second poly-Si layer 140 having conductive impurities in-situ doped is formed on the planar gate oxide layer 127. The MOS gates are formed on the mesas 118 by patterning the second poly-Si layer 140 and the planar gate oxide layer 127 thereunder. Aside the MOS gates are source regions having n+ implanted regions 155 extended to the surface of the n epi-layer 105 formed in the p body. Each source region further comprises a p+ region 165 formed under n+ implanted region 155 formed in the p body 135. The source contact pads SP are formed to connect n+ implanted regions 155 and p+ regions 165. The source contact pads SP are also connected the first poly-Si layer 130 in the trenches. The gate contact pads GP are formed on the second poly-Si layer 140.

Figure 2B:
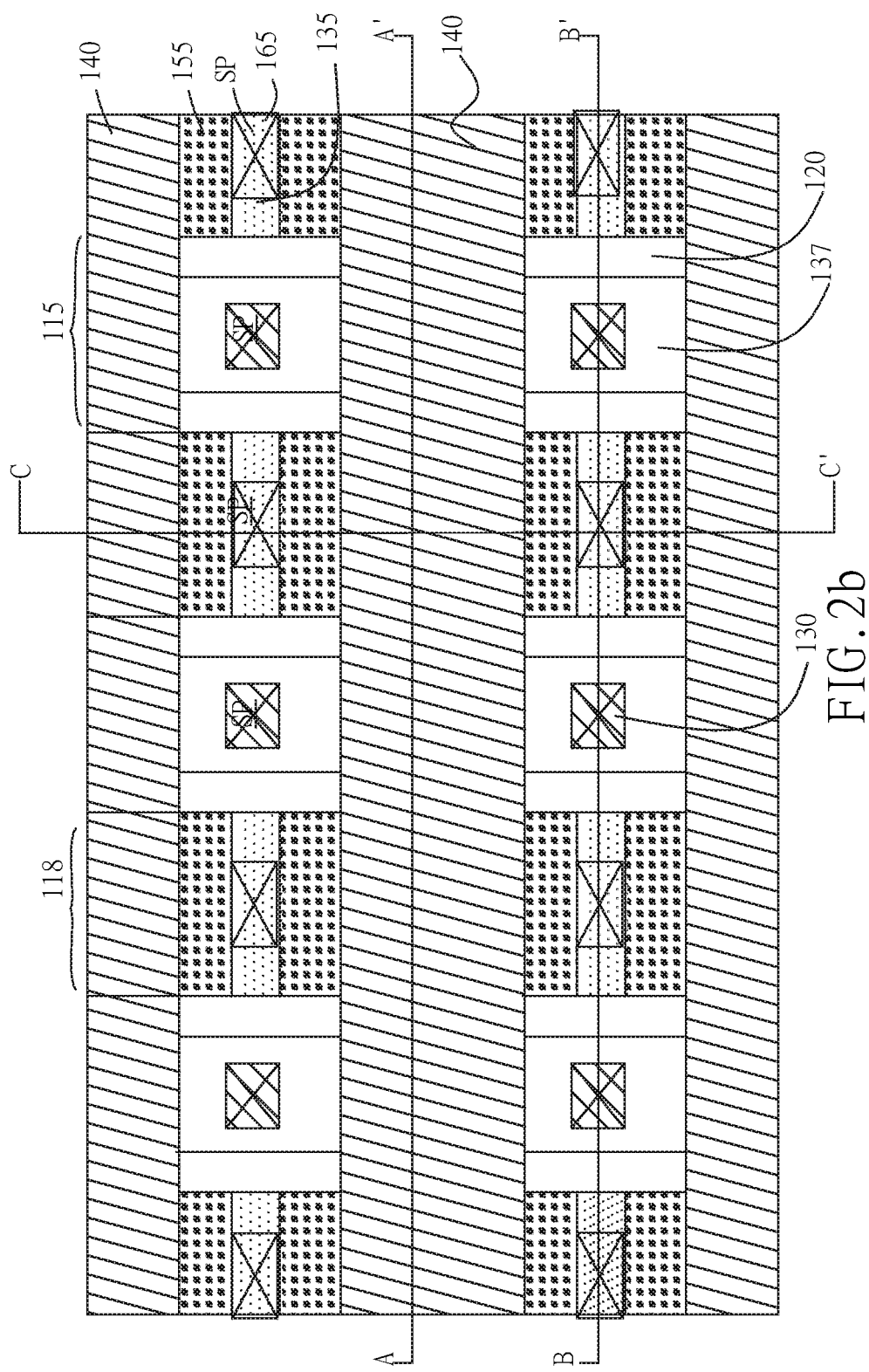
Figure 15A:
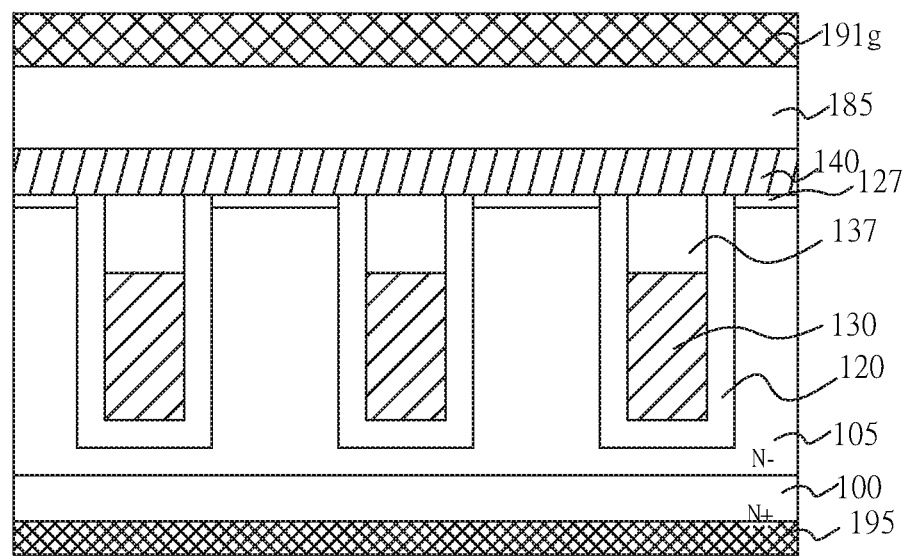
FIG. 15A, FIG. 15B and FIG. 15C are the cross-sectional views respectively, along the A-A' line, the B-B' line and the C-C' line shown in FIG. 2b illustrating the final structure of a VDMOS transistor in accordance with the second preferred embodiment of the present invention.
Figure 15B:
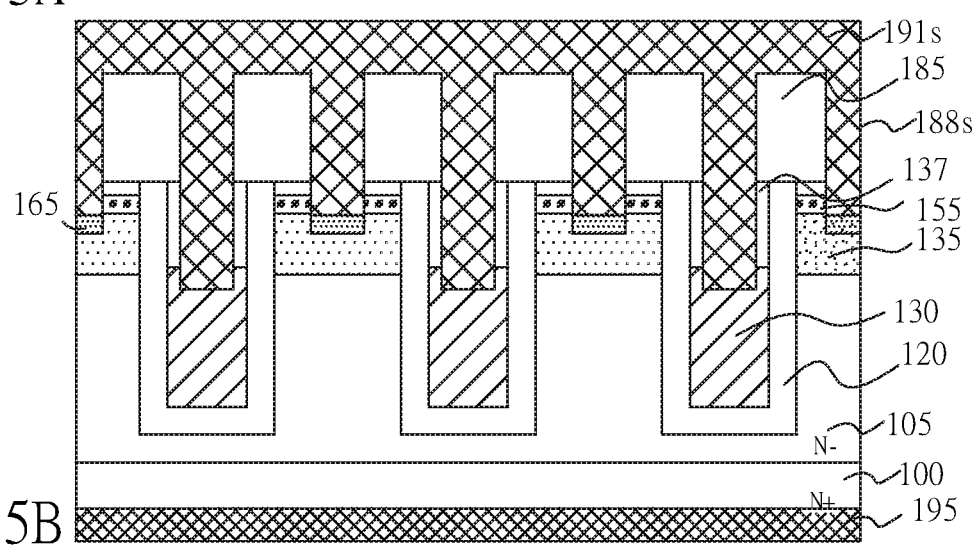
Figure 15C:
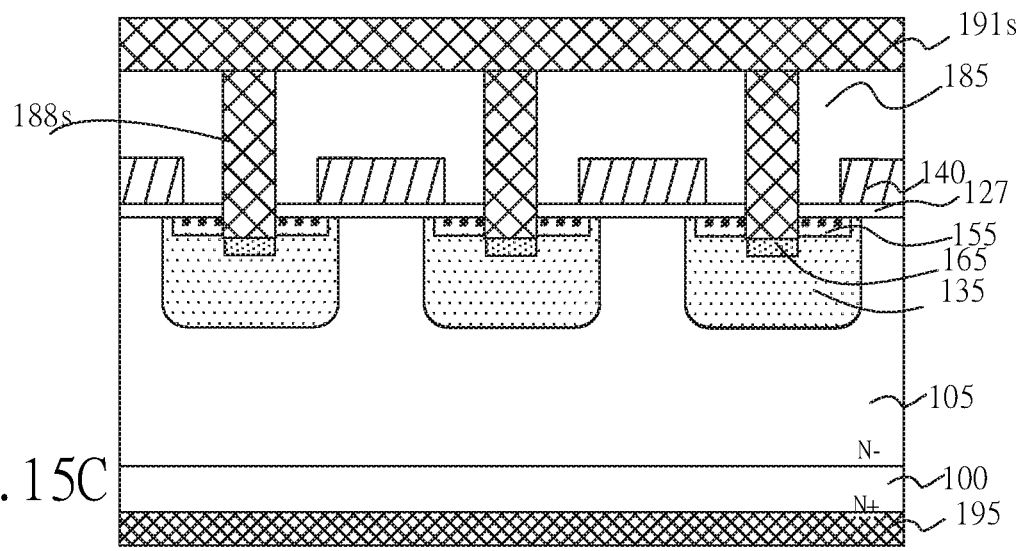

In accordance with a second preferred embodiment of the present invention, a trench VDMOS transistor is illustrated in the plan-view FIG. 2b and its cross-sectional views, FIG. 15A, FIG. 15B and FIG. 15C. The figures show an n− epi-layer 105 on a n+ semiconductor substrate 100 having a plurality of trenches 115 in parallel and spaced each other with a mesa 118 formed therein. A trench oxide layer 120 is conformally formed on bottoms and sidewalls of the trenches 115. A stack layer of a first oxide layer 13/a first conductive poly-Si layer 130 filled in the trenches 115. A planar gate oxide layer 127 is formed on the mesas 118. A plurality of rows of a second conductive poly-Si layer 140 extended to ends of the n+ substrate 100 are formed on the planar gate oxide layer 127 and the oxide layer 137 along a transversal direction of the trenches.

Asides the rows of the rows of the second poly-Si layer 140 are source regions formed in the n− epi-layer 105. Each of the source regions has a shallow n+ implanted region 155 extended to the mesa 118 formed into the p body 135. An inter-metal dielectric layer 185 formed on the resulted exposed surfaces. The inter-metal dielectric layer 185 has a plurality of source contact holes 187s formed therein. An interconnecting metal layer 191s is formed on the inter-metal dielectric layer 185 and filled in the source contact holes as source contact plugs 188s connecting the source region and the first poly-Si layer 130 through the first oxide layer 135. Under the source contact plugs 188s are p+ implanted regions 165 as source contact pads SP formed in the p body 135. A rear metal layer 195 served as a drain electrode formed on the rear n+ substrate 100.

The detailed processes for forming the structure of VDMOS transistor are as follows.

Figure 3:
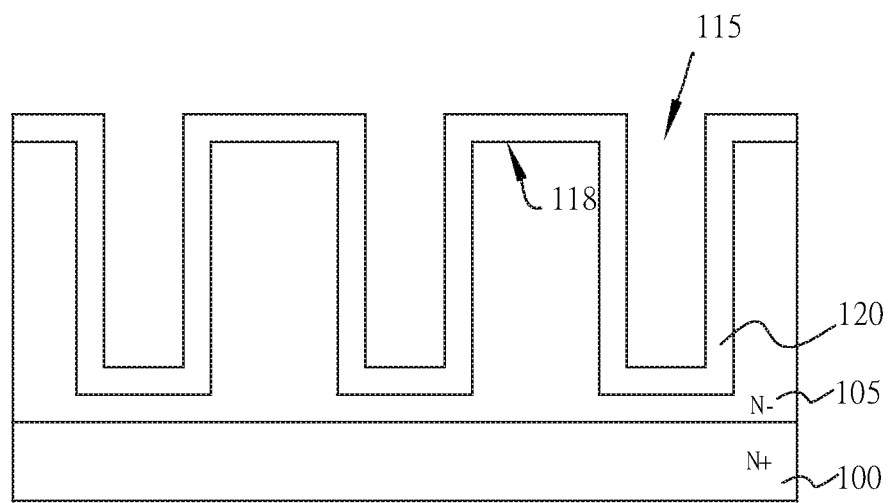

Please refer to FIG 3. The cross-sectional view depicts an n– epi-layer 105 on an n+ semiconductor substrate 100 having a plurality of trenches 115 in parallel formed therein and spaced each other with a mesa 118. The trenches 115 may be formed by a dry etch using a photoresist pattern layer or a hard mask layer with a patterned nitride layer/pad oxide as an etching mask (not shown).

Subsequently, a thermal oxidation process is carried out to form a trench oxide layer 120 conformally formed on the sidewalls and bottoms of the trenches and the mesas 118. The processes can repair the damage during etching.

Figure 4:
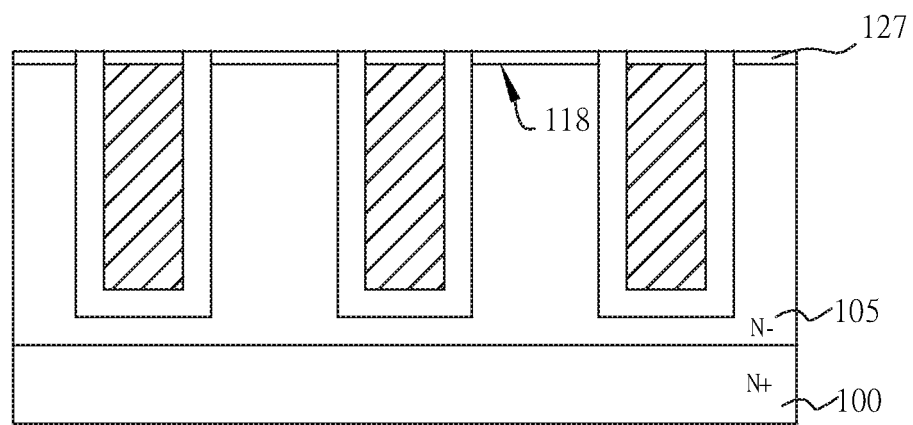

Referring to FIG. 4 a first poly-Si layer 130 with in-situ doped conductive impurities is deposited within the trenches 115 until overfilled. Thereafter, an etching back or a chemical mechanical polishing (CMP) technology is performed to remove the first poly-Si layer 130 over the mesas 118 and the trench oxide layer on the mesas 118 using the surface of the n– epi-layer 105 as an etching stop layer.

Figure 5A:
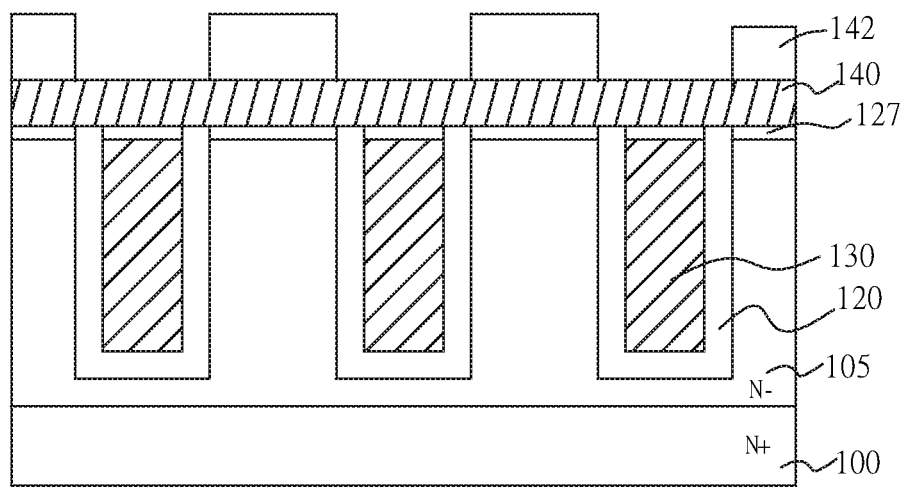
FIG. 5A, FIG. 5B and FIG. 5C are cross-sectional views respectively, along the A-A' line, the B-B' line and the C-C' line shown in FIG. 2a illustrating a photoresist pattern formed on a second conductive poly-Si layer to define positions of gates and source regions in accordance with the first preferred embodiment of the present invention.
Figure 5B:
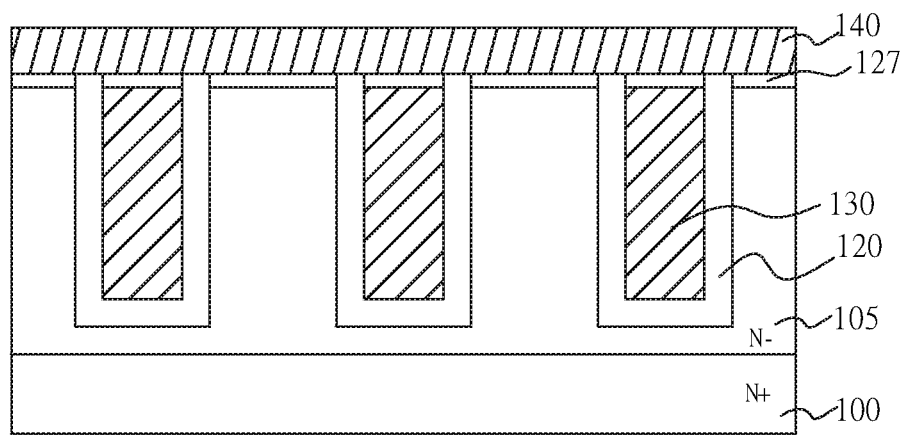
Figure 5C:
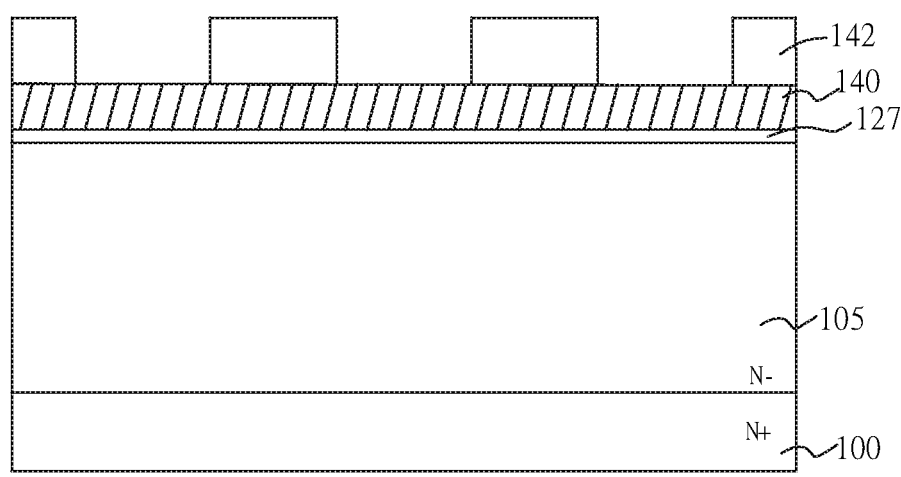

Still referring to FIG. 4, a thermal oxidation is carried out to form a planar gate oxide layer 127 on the first poly-Si layer 130 and the mesa 118. The planar gate oxide layer 127 is a thinning oxide layer than the trench oxide layer 120. Subsequently, a second poly-Si layer 140 is deposited on the planar gate oxide layer 127. A photoresist pattern 142 is formed on the second poly-Si layer 140 to define the positions of the planar MOS gate structure. FIG. 5A and FIG. 5B are, respectively, two cross-sectional views along a cutting line AA' and a cutting line BB' of FIG. 2a which are along two transversal directions of the trenches 115. FIG. 5C is a cross-sectional view along a cutting line CC' of FIG. 2a, which is along a longitudinal direction of the trench 115. Along the BB' cutting line, the second poly-Si layer 140 is exposed without a photoresist mask 142.

Figure 6A:
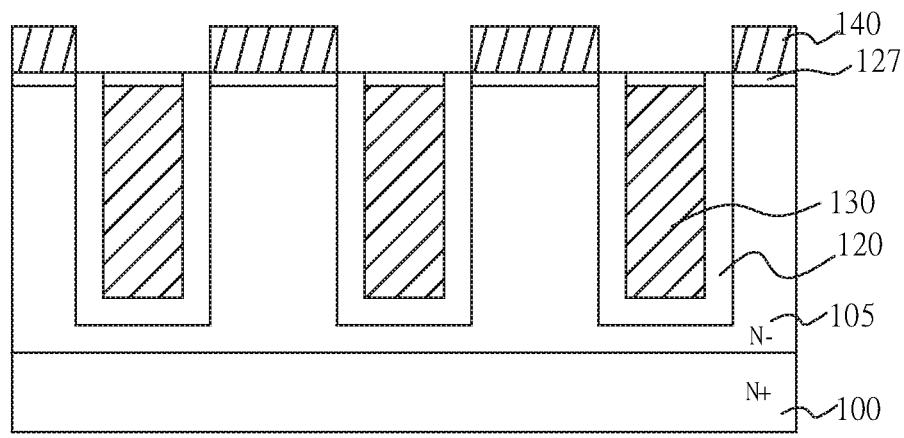
FIG. 6A, FIG. 6B and FIG. 6C are cross-sectional views respectively, along the A-A' line, the B-B' line and the C-C' line shown in FIG. 2a illustrating a patterned second conductive poly-Si layer as planar gates and source regions having doubled diffused impurities formed asides the planar gates in accordance with the first preferred embodiment of the present invention.
Figure 6B:
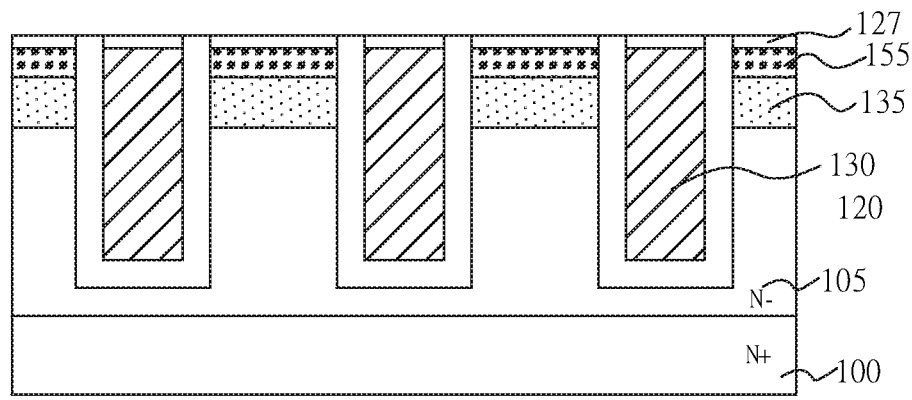
Figure 6C:
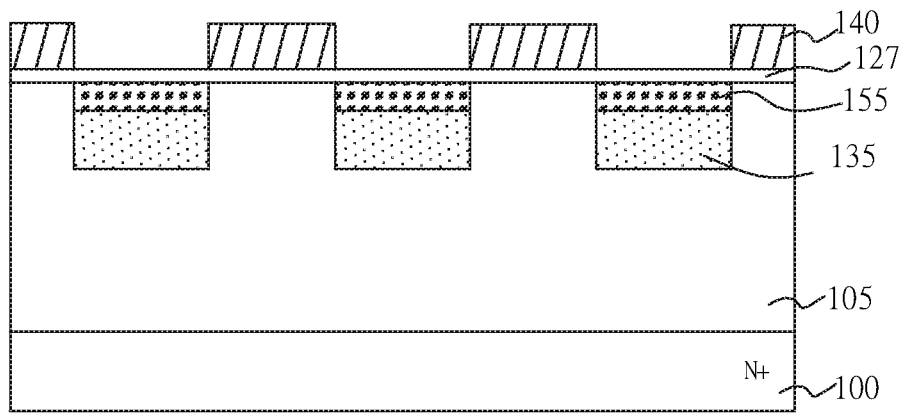

Please refer to FIG. 6A, FIG. 6B and FIG. 6C. An anisotropic etch is performed to pattern the second poly-Si layer 140 using the photoresist pattern 142 as an etching mask. The second poly-Si layer 140 is removed along the cutting line BB'. The discrete MOS gates are formed on the mesas 118. After a removal of photoresist pattern layer 142, a first ion implantation is performed to form p bodies 135 in the n– epi-layer 105 by implanting p type impurities such as $B^+$ or $BF_2^+$. The dosages and the energy for the first ion implantation are $1E12-1E14/cm^2$ and 10 keV-1000 keV, respectively. A second ion implantation by n type impurities such as $P^+$ and $As^+$ ions with a lower energy are performed to form a shallower n+ regions 155 in the p bodies 135. The doses for second ion implantation are between about $1E13-9E15/cm^2$, which are higher than that of the first ion implantation by 1-2 order(s) of magnitude.

Figure 7A:
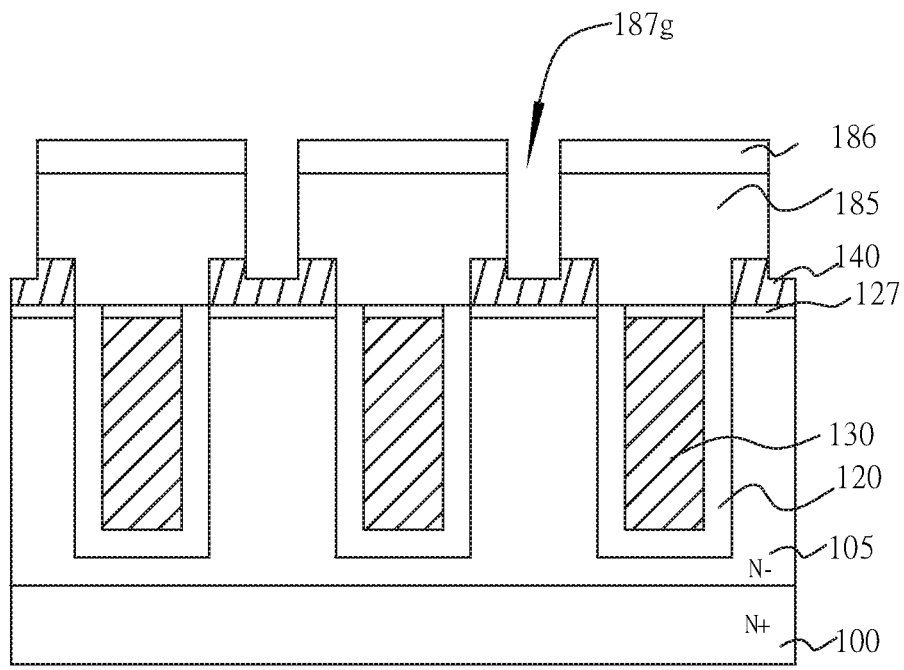
FIG. 7A, FIG. 7B and FIG. 7C are the cross-sectional views respectively, along the A-A' line, the B-B' line and the C-C' line shown in FIG. 2a illustrating an inter-metal dielectric layer formed on the resulted surfaces and a photoresist pattern formed and patterned to form source contact holes and gate contact holes in accordance with the first preferred embodiment of the present invention.
Figure 7B:
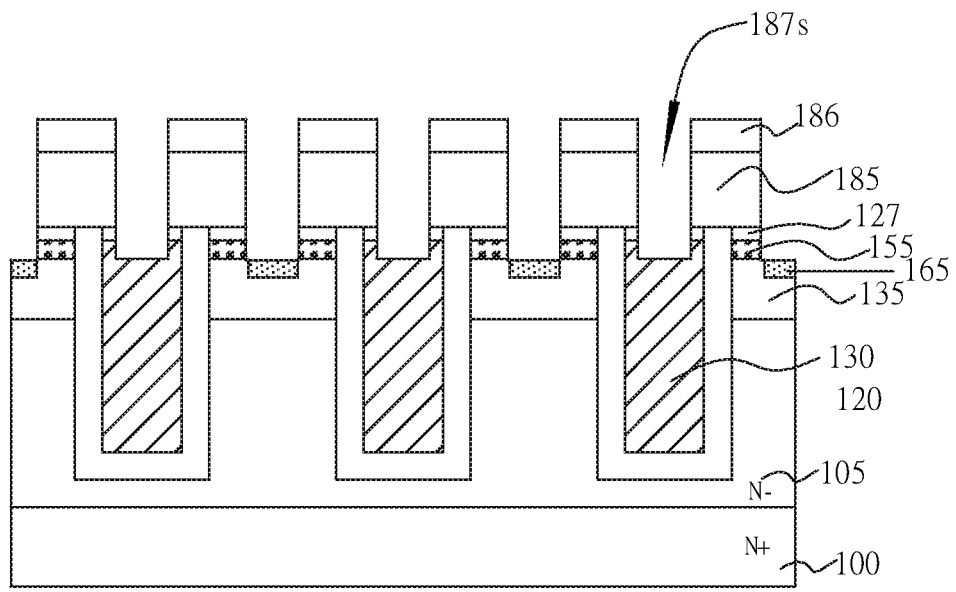
Figure 7C:
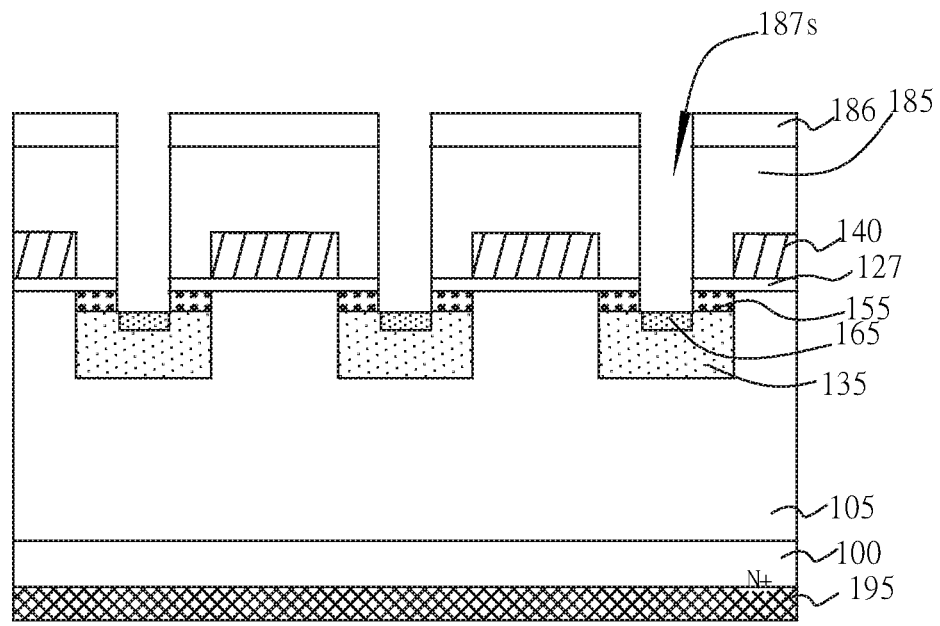

Referring to cross-sectional views FIG. 7A, FIG. 7B and FIG. 7C, an inter-metal dielectric layer 185 is deposited on the resulted surfaces. Subsequently, a photoresist pattern 186 is formed on the inter-metal dielectric layer 185 to define source contact holes 187s and gate contact holes 187g. Please refer to FIG. 2a, too. Along the cutting line AA' of FIG. 2a, the inter-metal dielectric layer 185 is formed with gate contact holes 187g to connect the second poly-Si layer 140. Along the cutting line BB' of FIG. 2a, the inter-metal dielectric layer 185 is formed with source contact holes 187s to connect the first poly-Si layer 130 and the source regions under the mesas 118.

Thereafter, an anisotropic dry etch is performed to pattern the inter-metal dielectric layer 185, the planar gate oxide layer 127, using the n– epi-layer 105 as an etching stop layer. Then a timing control etch is successively performed to remove the exposed n+ implanted regions 155. After the photoresist layer 186 is removed, a third ion implantation through the contact holes is carried out to form p+ regions 165 in the p bodies 135. After the ion implantations, an anneal process at a temperature between about 800-1000° C. to activate the impurities are carried out.

Subsequently, an interconnecting metal layer is deposited on the inter-metal dielectric layer 185 and filled in the contact holes 187s and 187g by sputtering. The interconnection metal layer is then patterned to two separate groups 191s and 191g. Group 191s connects the source region and the first poly-Si layer 130 through the source contact plugs 188s, as shown in FIG. 8B. Group 191g connects the second poly-Si layer 140 through the gate contact plugs 188g, as shown in FIG. 8B. The FIG. 8C shows 191s separated from the second 191g.

The interconnecting metal layer 191s, 191g may be a stack layer of Ti/TiN, TiNi/Ag or TiW/Al or a single metal layer formed of aluminum. The drain electrode of the VDMOS transistor is a rear metal layer 195 formed on the rear side of the n+ semiconductor 100.

Refer to FIG. 8C, interconnection metal group 191s consists of separate stripes needed to be connected together and connected to source pad, also interconnection metal group 191g consists of separate stripes needed to be connected together and connected to gate pad. The two pads cannot be connected with each other, so one more layer of interconnect metal, IMD and via are needed. The method to form the pads is obvious from this point thus not described.

Figure 9:
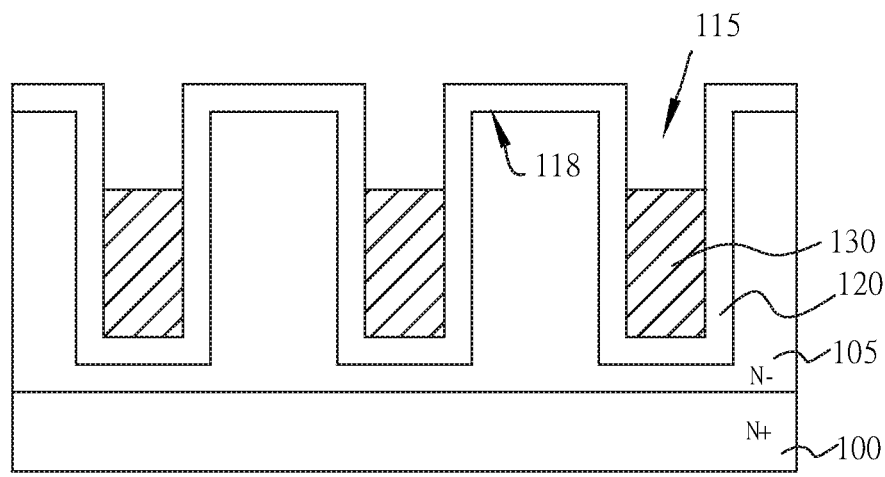
FIG. 9 is a cross-sectional view illustrating a first poly-Si layer filled in the trenches and then an etch back performed to form recesses in the trenches in accordance with the second preferred embodiment of the present invention.
Figure 10:
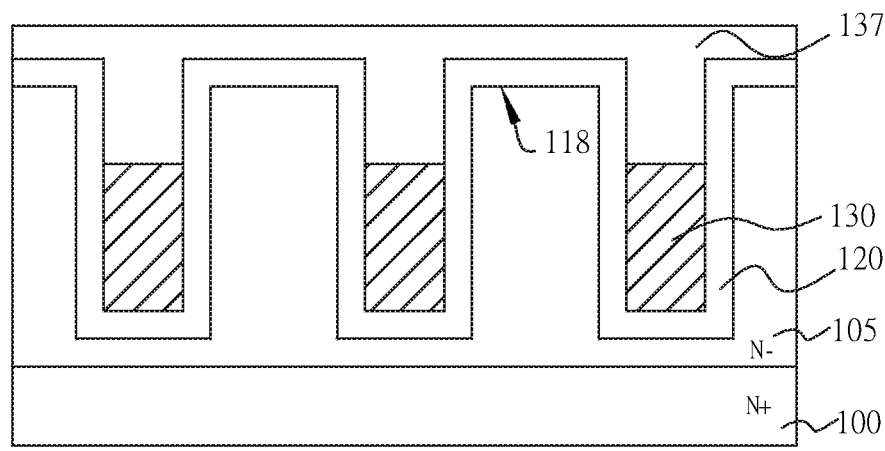
FIG. 10 is a cross-sectional view illustrating a first oxide layer overfilled the trenches in accordance with the second preferred embodiment of the present invention.
Figure 11:
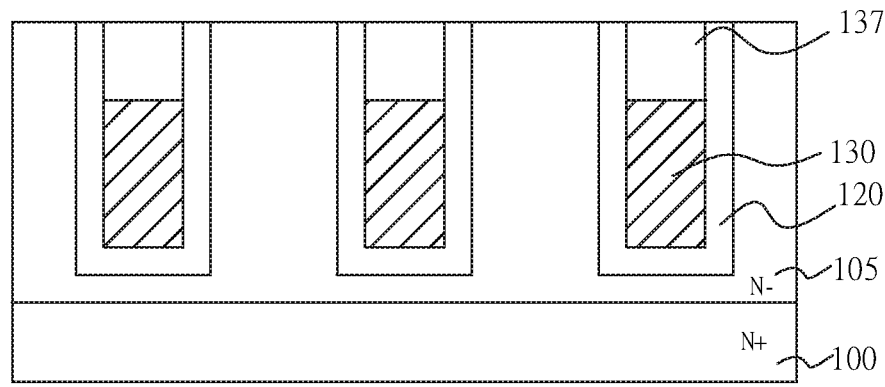
FIG. 11 is a cross-sectional view illustrating an etch back performed using the n− epi-layer as an etch stop layer in accordance with the second preferred embodiment of the present invention.

According to a second preferred embodiment, the illustrating diagram is started from the FIG. 9, which is followed from the FIG. 3. A first conductive poly-Si layer 130 is deposited on the trench oxide layer 120 until the poly-Si layer 130 overfilled the trenches 115. An etching back process is performed to remove the overfilled portion and further recess the first poly-Si layer 130 significantly. A first oxide layer 137 is then deposited to fill the recesses in the trenches 115 until overfilled. A CMP or a second etching back process is carried out to remove the first oxide layer 137 and the exposed planar gate oxide layer 127 using the n– epi-layer 105 as an etching stop layer. The results are shown in the FIG. 11.

Figure 12A:
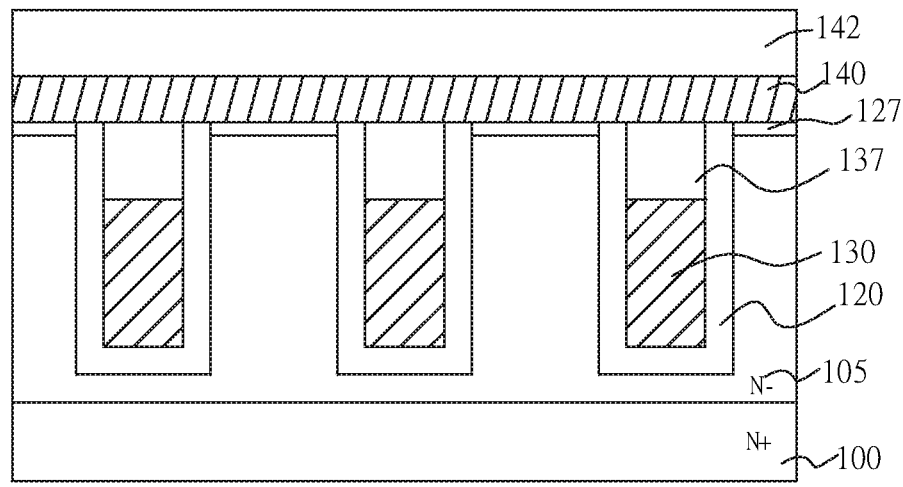
FIG. 12A, FIG. 12B and FIG. 12C are the cross-sectional views respectively, along the A-A' line, the B-B' line and the C-C' line shown in FIG. 2b illustrating a photoresist pattern formed on the second poly-Si layer to define a plurality of rows of the second poly-Si layer in accordance with the second preferred embodiment of the present invention.
Figure 12B:
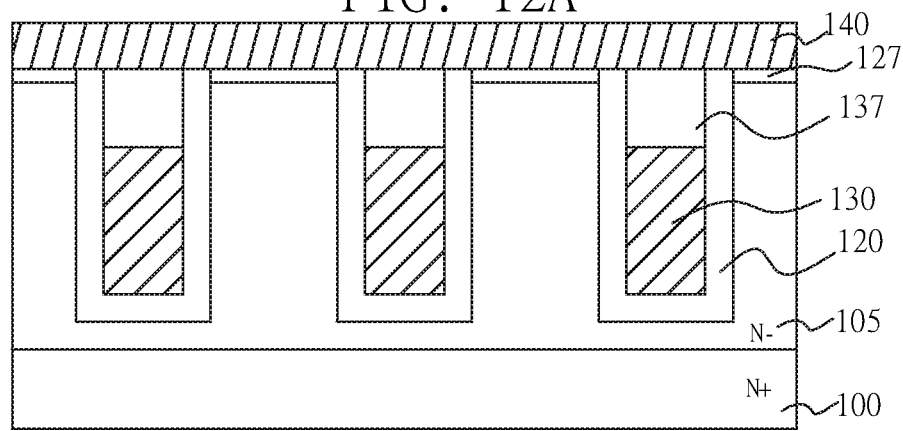
Figure 12C:
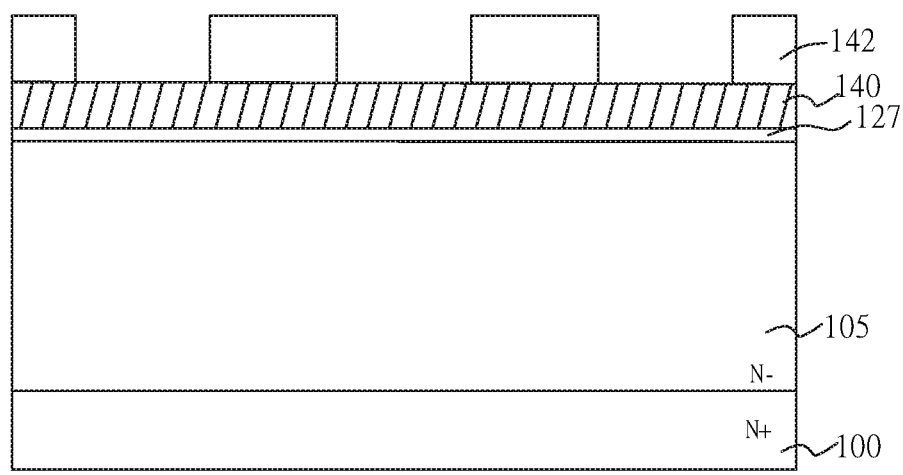
Figure 13A:
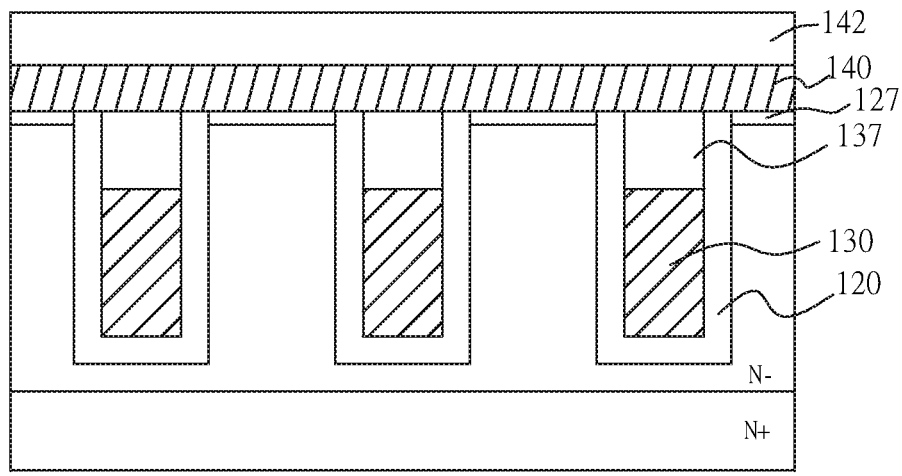
FIG. 13A, FIG. 13B and FIG. 13C are the cross-sectional views respectively, along the A-A' line, the B-B' line and the C-C' line shown in FIG. 2b illustrating a patterned second poly-Si layer and doubled diffused source regions formed asides the gates in accordance with the second preferred embodiment of the present invention.
Figure 13B:
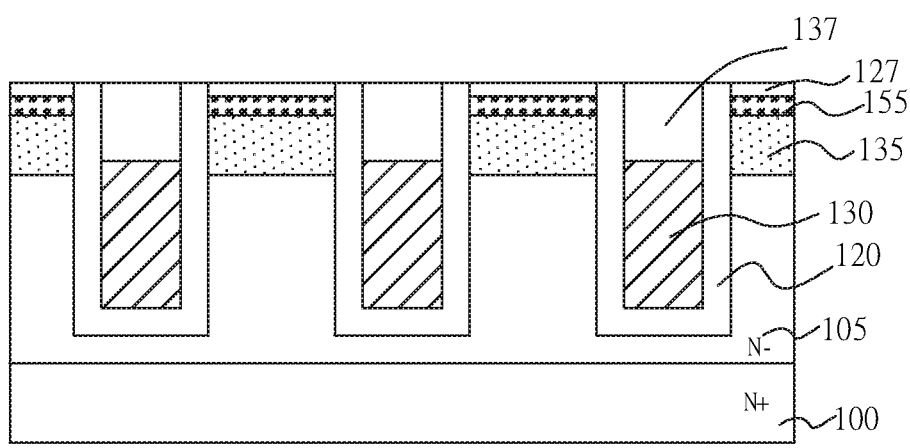
Figure 13C:
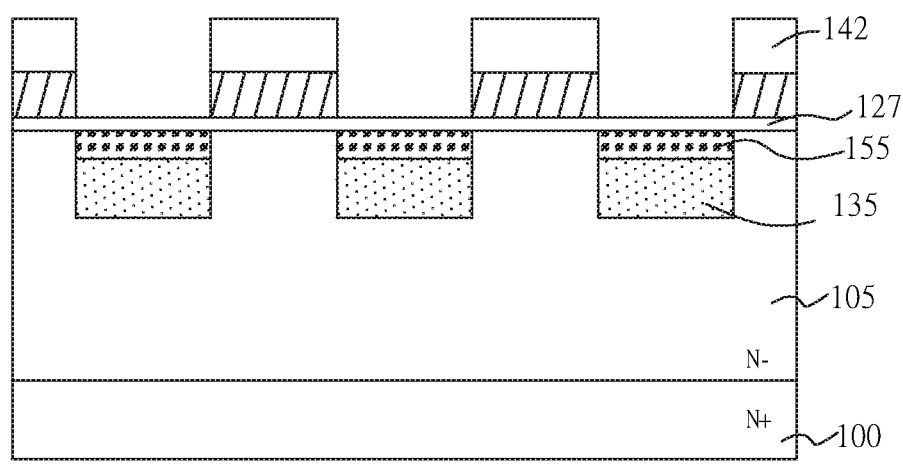

Thereafter, a thermal process is performed to form the planar oxide layer 127 again, and a second poly-Si layer 140 with in-situ doped conductive impurities deposited on the planar gate oxide layer 127 is followed. A photoresist pattern 142 is formed on the second poly-Si layer 140 to define a plurality of rows of the second poly-Si layer 140 as gates, as shown in cross-sectional views FIG. 12A, FIG. 12B and FIG. 12C, Along the cutting line AA' of FIG. 2b, the photoresist pattern 142 is masked on the second poly-Si layer 140. The rows of the second poly-Si layer 140s are along a transversal direction of the trenches 115. Please refer to FIG. 13, FIG. 13B and FIG. 13C, an anisotropic etch is performed to pattern the second poly-Si layer 140 using the photoresist pattern 142 as an etching mask. The second poly-Si layer 140 is removed along the cutting line BB' of FIG. 2b, After a removal of photoresist pattern layer 142, a first ion implantation is performed to form p bodies 135 in the n– epi-layer 105 by implanting p type impurities such as $B^+$ or $BF_2^+$. The dosages and the energy for the first ion implantation are $1E12-1E14/cm^2$ and 10 keV-1000 keV, respectively. A second ion implantation by n type impurities such as $P^+$ and $A^+$ ions with a lower energy are performed to form a shallower n+ regions 155 in the p bodies 135. The doses for second ion implantation are between about $1E13$-$9E15/cm^2$, which are higher than that of the first ion implantation by 1-2 order(s) of magnitude.

Figure 14A:
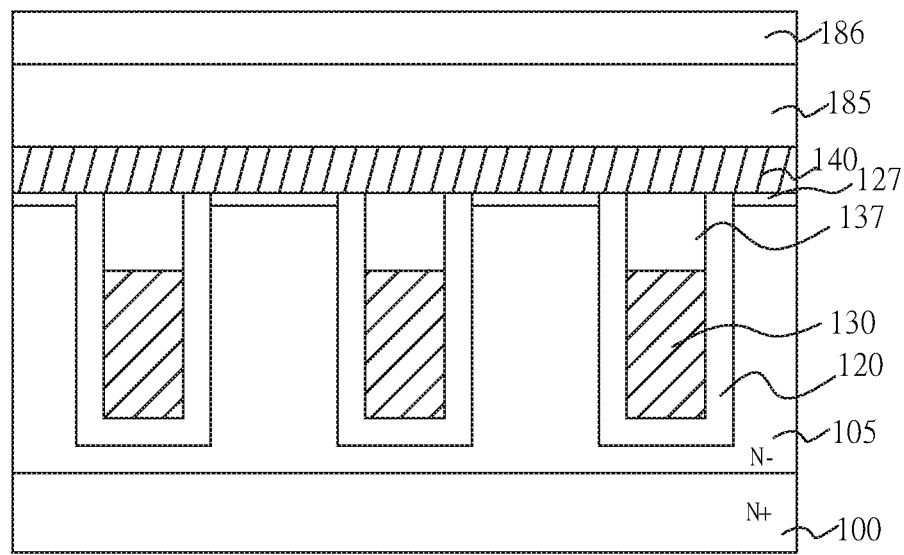
FIG. 14A, FIG. 14B and FIG. 14C are the cross-sectional views respectively, along the A-A' line, the B-B' line and the C-C' line shown in FIG. 2b illustrating an inter-metal dielectric layer formed on the resulted surfaces and a photoresist pattern formed and patterned to form source contact holes in accordance with the second preferred embodiment of the present invention.
Figure 14B:
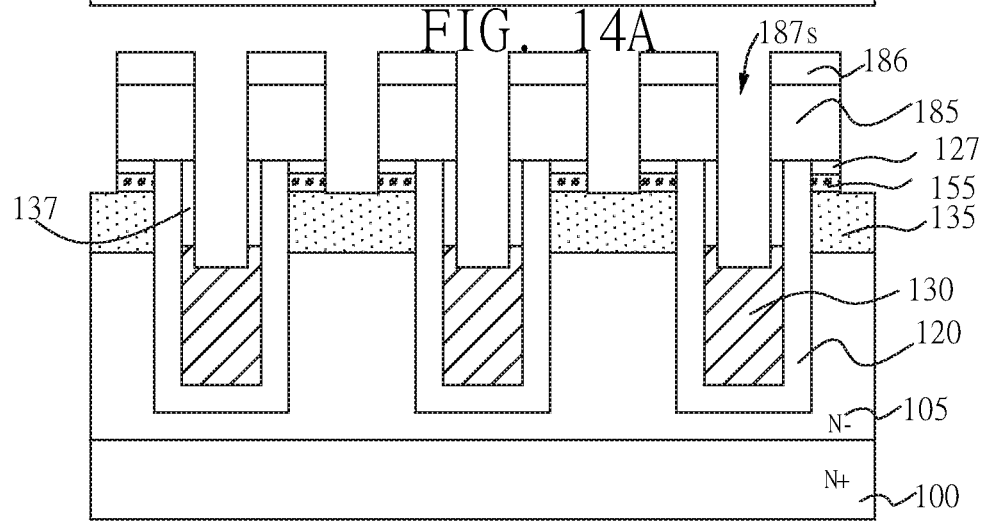
Figure 14C:
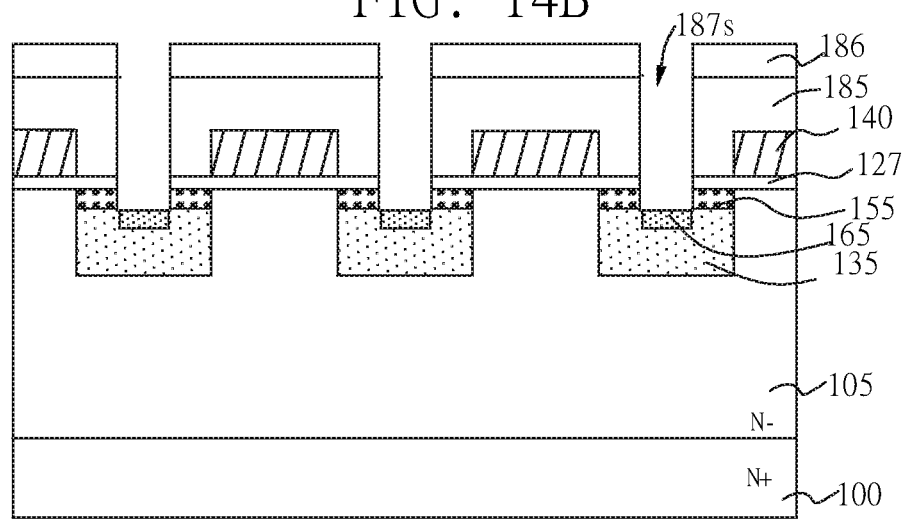

Referring to cross-sectional views of FIG. 14A, FIG. 14B and FIG. 14C, an inter-metal dielectric layer 185 is deposited on the resulted surfaces. Subsequently, a photoresist pattern 186 is formed on the inter-metal dielectric layer 185 to define the positions of source contact holes 187s. An anisotropic dry etch is performed to form source contact holes 187s by patterning the inter-metal dielectric layer 185, the planar gate oxide layer 127 and the first oxide layer 137, using the n− epi-layer 105 as an etching stop layer. Then a timing control etch is successively performed to remove the exposed n+ implanted regions 155. After the photoresist layer 186 is removed, a third ion implantation is carried out through the source contact holes 187s to form p+ regions 165 in the p bodies 135. After the ion implantations, an anneal process at a temperature between about 800-1000° C. to activate the impurities are carried out.

Subsequently, an interconnecting metal layer 191s is deposited on the inter-metal dielectric layer 185 and filled in the source contact holes 187s by sputtering. The results are shown in FIGS. 15A, 15B, and 15C. The interconnecting metal layer connected to the source regions and the first poly-Si layer 130 through source contact plugs 188s, as shown in FIG. 15A, FIG. 15B, and FIG. 15C. The interconnecting metal layer 191s, 191g may be a stack layer of Ti/TiN, TiNi/Ag or TiW/Al or a single metal layer formed of aluminum. The rows of the second poly-Si layer 140 served as gates, which is extended to the ends of the substrate 100. The drain electrode of the VDMOS is a rear metal layer 195 formed on the rear side of the n+ semiconductor 100.

In the second preferred embodiment, the gate contact plugs are formed on the ends of the second poly-Si layer 140 only.

Figure 1A:
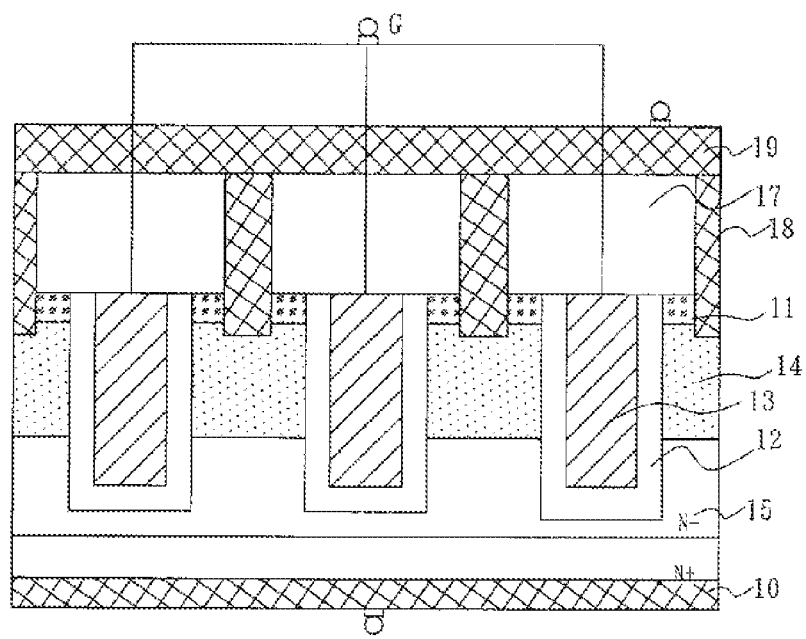
Figure 1B:
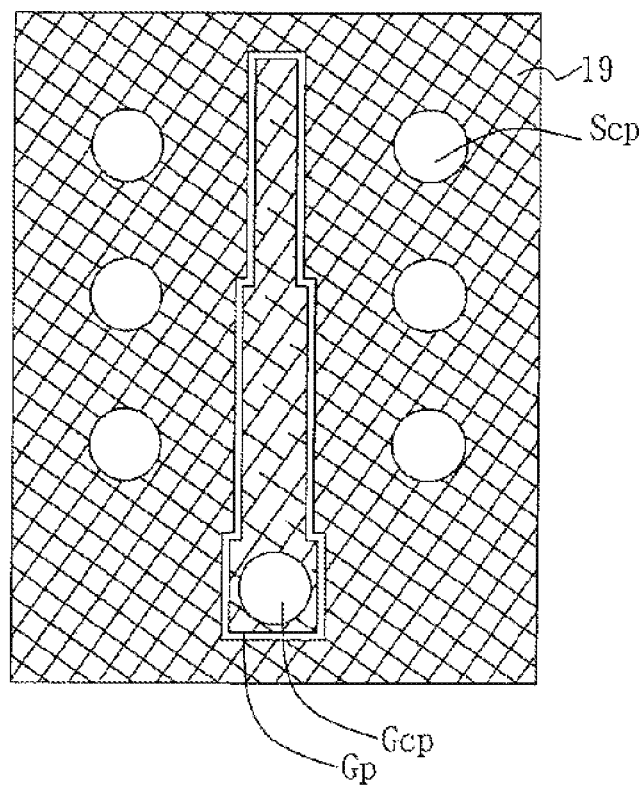

The benefits of the present invention are:
(1). The VDMOS transistor according to the present invention has a better capability of reverse break down voltage performance than the prior art, shown in FIG. 1 while the resistivity of the n-epi layer is the same as that of prior art.
(2). The VDMOS transistor according to the present invention includes a planar MOS gate whose planar gate oxide layer 127 is much thinner than the trench gate oxide layer 120 so that the VDMOS transistor has a lower threshold forward voltage than the VDMOS transistor in accordance with the prior art, shown in FIG. 1.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures. For instance, the aforementioned exemplary embodiments are illustrated by n type VDMOS transistor formed on the n type substrate; the processes may be applied to form p-type VDMOS transistor formed on p type substrate.

What is claimed is:
1. A method of forming a trench vertical doubled diffused transistor (VDMOS transistor), said method comprising the steps of:
providing an impurity-lightly doped epi-layer of a first conductive type on an impurity-heavily doped semiconductor substrate of said first conductive type, said impurity-lightly doped epi-layer having a plurality of trenches in parallel formed therein, adjacent trenches of said plurality of trenches spaced apart from each other by a respective mesa of a plurality of mesas;
forming a trench oxide layer on a bottom and sidewalls of each trench of said plurality of trenches and on said plurality of mesas;
forming a first conductive poly-Si layer to fill in and over said plurality of trenches;
recessing said first conductive poly-Si layer to form a plurality of recesses, each recess of said plurality of recesses in a respective trench of said plurality of trenches;
depositing a first oxide layer over said plurality of recesses and said plurality of mesas;
etching back said first oxide layer using said impurity-lightly doped epi-layer as an etching stop;
forming a gate oxide layer on said plurality of mesas;
forming a second conductive poly-Si layer on said first oxide layer and said gate oxide layer;
forming a first photoresist pattern on said second conductive poly-Si layer, said first photoresist pattern having a plurality of openings in parallel along a transversal direction of said plurality of trenches;
patterning said second conductive poly-Si layer to form a plurality of rows of said second conductive poly-Si layer and to expose said gate oxide layer and said first oxide layer, using said first photoresist pattern as an etching mask;
performing a first ion implantation through said gate oxide layer with a first implanting energy and a first dose of impurities of a second conductive type to form a plurality of bodies, each body of said plurality of bodies into a respective mesa of said plurality of mesas;
performing a second ion implantation through said gate oxide layer with a second implanting energy and a second dose of impurities of said first conductive type to form a plurality of implanting regions, each implanting region of said plurality of implanting regions into a respective body of said plurality of bodies, wherein said second implanting energy is lower than said first implanting energy and said second dose is higher than said first dose;
stripping said first photoresist pattern;
forming an inter-metal dielectric layer on said plurality of rows of said second conductive poly-Si layer, said plurality of mesas, and said first oxide layer;
forming a second photoresist pattern on said inter-metal dielectric layer, said second photoresist pattern having openings to expose predetermined regions of source contact holes;
anisotropic etching through said inter-metal dielectric layer, said first oxide layer and into a portion of said first conductive poly-Si layer, and through said inter-metal dielectric layer, gate oxide layer, and said plurality of implanting regions to form said source contact holes using said second photoresist pattern as an etching mask;
performing a third ion implantation to implant impurities of said second conductive type with a third dose into bottoms of said source contact holes;
removing said second photoresist pattern;
forming an upper metal layer on said inter-metal dielectric layer and filling said source contact holes to form source contacts with said upper metal layer;
milling a rear surface of said impurity-heavily doped semiconductor substrate to a predetermined thickness;
forming a bottom metal layer on said rear surface of said impurity-heavily doped semiconductor substrate as a drain electrode.
2. The method of forming a trench vertical doubled diffused transistor (VDMOS transistor) according to claim 1 wherein said first oxide layer in said plurality of recesses has a thickness thicker than that of said gate oxide layer.

* * * * *